United States Patent [19]

Hayes et al.

[11] Patent Number: 5,614,906
[45] Date of Patent: Mar. 25, 1997

[54] METHOD FOR SELECTING A REMOTE CONTROL COMMAND SET

[75] Inventors: Patrick H. Hayes, Mission Viejo; Kimthoa T. Nguyen, Yorba Linda, both of Calif.

[73] Assignee: Universal Electronics Inc., Twinsburg, Ohio

[21] Appl. No.: 636,666

[22] Filed: Apr. 23, 1996

[51] Int. Cl.$^6$ .................................................. G08C 19/12
[52] U.S. Cl. .............. 341/176; 340/825.37; 340/825.69; 340/825.72; 359/148; 379/102
[58] Field of Search .................................. 341/176, 173, 341/174, 175, 23; 348/734; 359/148; 364/709.14, 709.15, 709.16; 379/102; 340/825.37, 825.69, 825.72

[56] References Cited

U.S. PATENT DOCUMENTS

| | | | |
|---|---|---|---|
| 4,703,359 | 10/1987 | Rumbolt et al. | 340/825.69 |
| 4,746,919 | 5/1988 | Reitmeier | 340/825.72 |
| 4,825,209 | 4/1989 | Sasaki et al. | 340/825.37 |
| 4,959,810 | 9/1990 | Darbee et al. | 340/825.69 |
| 4,999,622 | 3/1991 | Amano et al. | 341/176 |
| 5,420,573 | 5/1995 | Tanaka et al. | 341/176 |
| 5,453,738 | 9/1995 | Zirkl et al. | 340/825.72 |
| 5,485,149 | 1/1996 | Takiguchi et al. | 359/148 |
| 5,537,463 | 7/1996 | Escobosa et al. | 379/102 |

*Primary Examiner*—Jeffery Hofsass
*Assistant Examiner*—Andrew Hill
*Attorney, Agent, or Firm*—Thomas R. Vigil; Gary Jarosik; Mark R. Galis

[57] ABSTRACT

A method for selecting a command set from a group of command sets stored in the remote control. Each remote control command set includes a set of commands for operating at least one of various remotely controllable devices. A command, whose effect is observable in the remotely controlled device is assigned to one of the user actuated keys. The keys are pressed one by one until the user observes the desired effect on the remotely controlled device. The user then signals the remote control to exit the select procedure with the remote control setting the remote control to transmit future commands from the command set including the last transmitted effects observable command having the observed desired effect.

16 Claims, 6 Drawing Sheets

METHOD FOR SELECTING A REMOTE CONTROL COMMAND SET

BACKGROUND OF THE INVENTION

1. Field of the Invention

The present invention relates to a method for selecting a remote control command set from a group of multiple command sets stored in a remote control, for controlling various remotely controllable electronic devices.

2. Description of the Related Art Including Information Disclosed Under 37 CFR §§ 1.97–1.99

Heretofore, various systems for providing methods of selecting a remote control command set from a group of multiple command sets have been proposed. Several examples of analogous and non-analogous methods are disclosed in the following U.S. Patents:

| U.S. Pat. No. | Patentee |
| --- | --- |
| 4,703,359 | Rumbolt et al. |
| 4,959,810 | Darbee et al. |
| 5,485,149 | Takiguchi et al. |
| German Patent Publications: | |
| DE 33 13 493 A1 | Telefunken |

The Rumbolt et al., U.S. Pat. No. 4,703,359 discloses a method for adapting a remote control to generate a remote command signal having the appropriate signal structure for controlling a selected one of a plurality of electronic devices. Once the method is initiated, the remote control automatically cycles through the entire list of different format command lists stored within the remote control's internal memory, transmitting a test command to the desired device to be controlled until the user interrupts the cycle. Interrupting the cycle of test commands causes the remote control to transmit future commands using the signal structure of the last test command transmitted prior to interrupting the cycle.

The Darbee et al., U.S. Pat. No. 4,959,810 discloses a universal remote control system that provides for two methods for selecting a remote control command set.

The first method is a step and set procedure in which the list of command sets stored in the remote control are stepped through both forward and backwards allowing a test command from the currently selected command set to be transmitted. The user observes the effects of the test command to determine if the currently selected command set is compatible with the device the user is wanting to control. When the user finds a command set compatible with the device to be controlled, the user exits the procedure with the remote control set to the compatible command set.

The second method is a direct entry—quick set procedure in which the user looks up the make and model of the of the device to be controlled from a printed list of devices. The user then directly inputs a corresponding code associated with the make and model of the device to be controlled to index the proper command set from the remote control's internal command set library.

The Takiguchi et al., U.S. Pat. No. 5,485,149 discloses a method for selecting a set of remote control signals from multiple remote control signal groups, where each group contains multiple sets of remote control signals. Each remote control signal group is assigned to one of the operating keys.

Upon entering a select setting mode, the particular set of remote control signals within one of the signal groups is selected by the number of times the assigned operating key is pressed. A single keypress will select the first set of remote control signals within the remote control signal group assigned to the pressed key. Pressing the same key a second time will select the second set of remote control signals within the assigned remote control signal group. Similarly, subsequent key presses of the same key will select subsequent sets of remote control signals.

The Telefunken, German published patent application DE 33 13 493 A1 discloses a remote control having a table containing multiple columns of control signals each column containing the code signals for operating a particular device and a mechanism for selecting the appropriate column of control signals.

The remote control provides for the selection of the appropriate column of control signals by automatically cycling through the multiple columns of control signals, transmitting a trial command, and observing the effect of the trial command on the device to be remotely operated. When the desired result is observed, the user signals the remote control that a successful command has been transmitted. The remote control then eliminates from consideration all columns of control signals that do not contain the matched successful trial command. If more than one column of control signals match the successful trial command, the remote control repeats the above procedure using a different trial command and cycling through only the remaining columns of control signals until all columns of command signals have been eliminated except one.

SUMMARY OF THE INVENTION

According to the present invention there is provided a method for selecting a remote control command set from a group of multiple command sets stored in a remote control, for controlling various remotely controllable electronic devices. The method includes assigning multiple effects observable commands (e.g. a "power off" command) from a group of command sets stored in the remote control to multiple user actuated switches or keys of the remote control.

The user then actuates the switches or keys, one at a time, with the corresponding assigned effects observable command being transmitted. The user continues to actuate keys until the user observes the remotely controlled device responding properly to the transmitted command. The user then terminates the selection procedure with the remote control setting the active command set to the command set from which the successful effects observable command was assigned.

By assigning a single command set to a single user actuated key, the negative effects of a user key actuation that results in a double key actuation or not registering due to failure to fully actuate the key is minimized. If the user suspects the key was not fully actuated, the user can repeat that particular key actuation. If the user inadvertently causes the remote to detect a double key actuation, the remote control merely sends the effects observable command from the assigned command set twice. If the user wishes to actuate a particular key several times in order to confirm its effect on the responding device, he may do so at any point during the process without affecting the process.

The command sets stored in the remote control can be permanently stored in the remote control at the time of manufacture or downloaded from an external source. The ability to download command sets from an external source allows the remote control to provide remote control functionality with future devices whose particular transmission protocol or commands have not yet been determined.

The method for selecting a remote control command set from a group of multiple command sets stored in a remote control, further provides for inputting a criteria code for limiting or filtering the list of command sets to be searched through to those command sets that work with devices meeting a particular criteria. In this way, the entire list of command sets do not need to be searched through. Similarly it does not require the user to know all the details about a particular device in order to determine and set the appropriate command set.

Where the number of command sets to be searched through exceeds the number of keys with which the effects observable commands are assigned, the method additionally provides for the ability to page through sub-groups of command sets. Each subgroup being no larger than the number of assignable keys.

Where a remote control provides for multiple modes, each mode providing for the remote operation of a different device (i.e. TV, VCR, cable box, etc.), a different command set can be selected for each of the available modes.

Other objects and advantages of the present application will be apparent from the detailed description and drawings which follow.

DESCRIPTION OF THE PREFERRED EMBODIMENT

Figure 1:
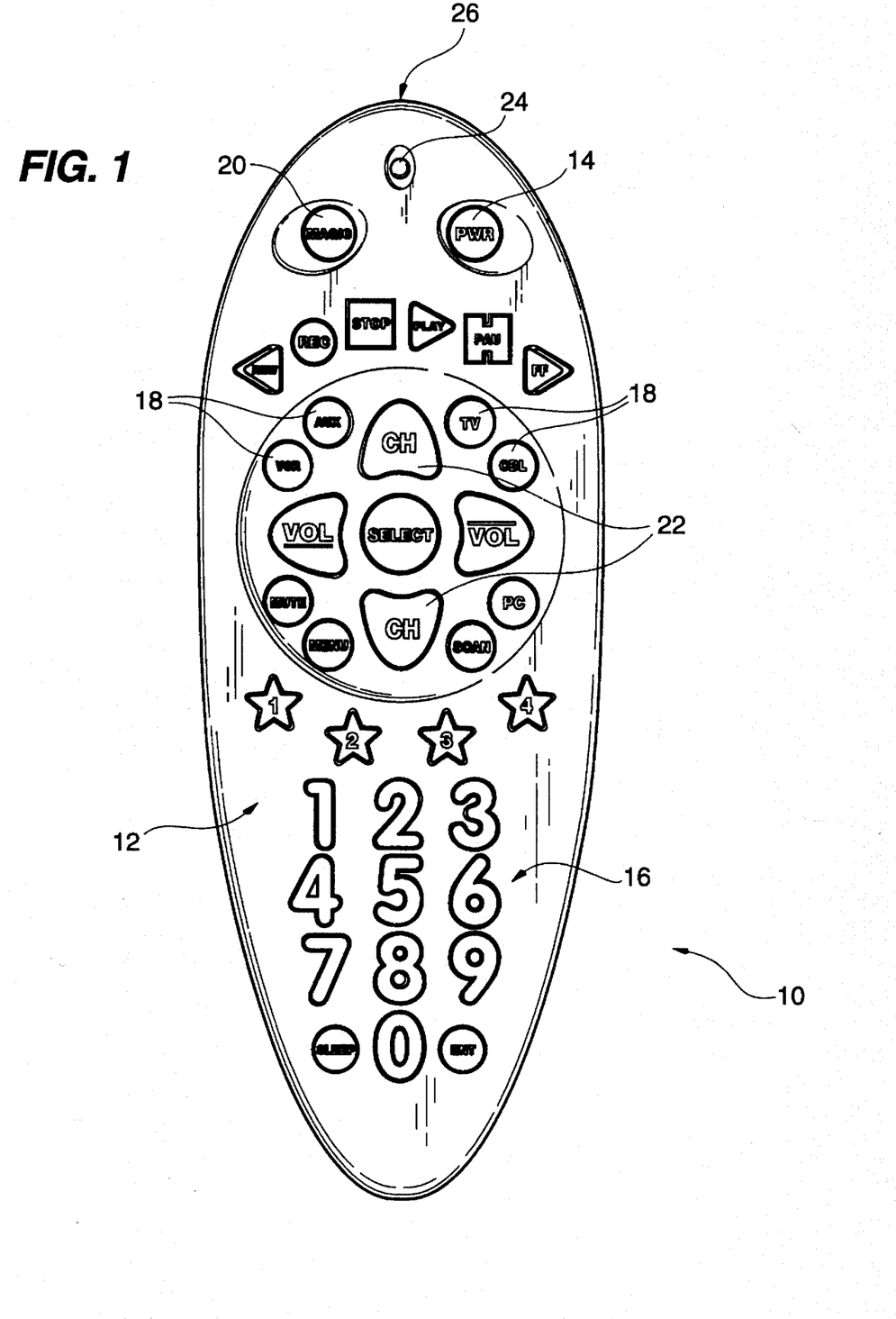
FIG. 1 is a top plan view of the top face of a remote control incorporating the method for selecting a remote control command set from a group of multiple command sets stored in the remote control.

Referring now to the drawings in greater detail, there is illustrated in FIG. 1 a plan view of the top face of a remote control 10 incorporating the method for selecting a remote control command set from a group of multiple command sets stored in the remote control.

The remote control includes a set of user actuated keys 12, including a power key 14, numeric keys 16, mode keys 18, a magic key 20, and channel up and channel down keys 22. The remote control 10 further includes a visual LED 24 and an infra-red LED (not shown), located at the front 26 of the remote control 10.

Figure 2:
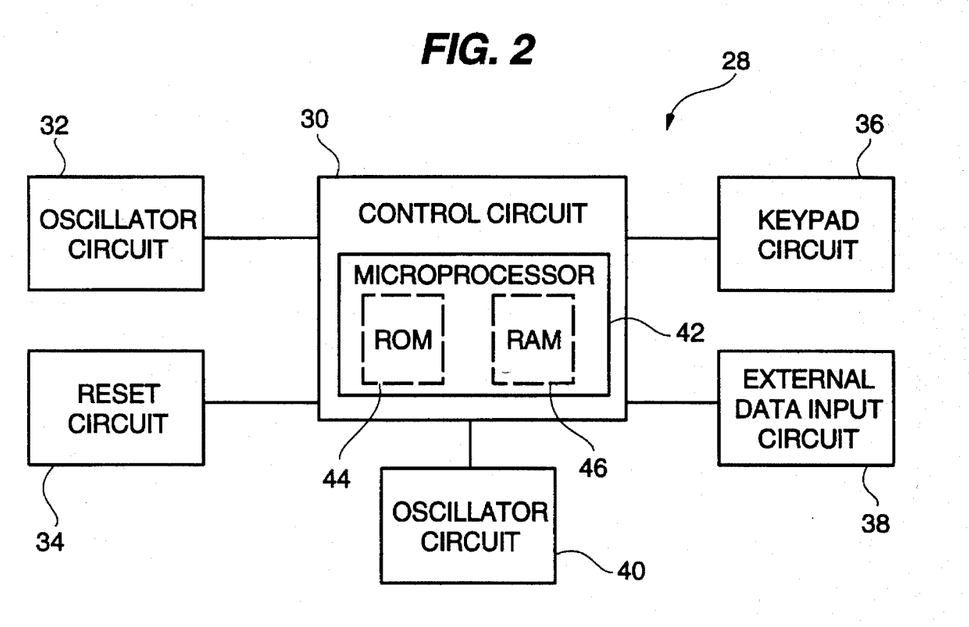
FIG. 2 is a block diagram of the internal circuitry of the remote control shown in FIG. 1.

FIG. 2 is a block diagram of the internal circuitry 28 of the remote control shown in FIG. 1. The internal circuitry 28 is similar to the circuitry described in *Escobosa* et al., U.S. Ser. No. 08/251,336, filed May 31, 1994, now U.S. Pat. No. 5,537,463, whose specification is incorporated herein by reference.

The internal circuitry 28 includes a control circuit 30, an oscillator circuit 32, a reset circuit 34, a key pad circuit 36, an external data input circuit 38, and an LED driver circuit 40.

The control circuit 30 monitors and controls the overall functioning of the remote control 10. In a preferred embodiment it incorporates a microprocessor 42, with associated semiconductor memory in the form of ROM 44 and/or RAM 46. The semiconductor memory is used to store both program operating instructions and program data for assisting in the control of the remote control 10.

The oscillator circuit 32 provides a clocking signal to the control circuit 30. The reset circuit 34 provides a reset signal to the control circuit when the internal circuitry 28 is initially powered up. The key pad circuit 36 incorporates the user actuated keys 12 and provides circuitry in conjunction with the control circuit 30 for decoding which one of the user actuated keys 12 has been actuated.

The external data input circuit 38 receives data from a source external to the remote control 10. The particular circuitry can take the form of any one of many traditional forms of communication, whether wired or wireless. In one preferred embodiment the external data communication is accomplished by a magnetic modem similar to the one described in the Escobosa application, U.S. Ser. No. 08/251,336, filed May 31, 1994, referred to above.

The LED driver circuit 40 is coupled to the control circuit 30 and incorporates the visual LED 24 and the infra-red LED (not shown) located at the front 26 of the remote control 10 and provides the LEDs with driving power in response to signals received from the control circuit 30. The visual LED 24 provides the user with visual feedback concerning the remote control's 10 activity. The infra-red LED provides the signalling capability for sending the remote control signals to the devices to be controlled.

FIGS. 3A, 3B, 3C and 3D are each portions of a flow chart that together provide instructions for assisting in the control of the remote control with particular emphasis on the steps that provide for the method of selecting a remote control command set from a group of multiple command sets stored in the remote control.

Figure 3A:
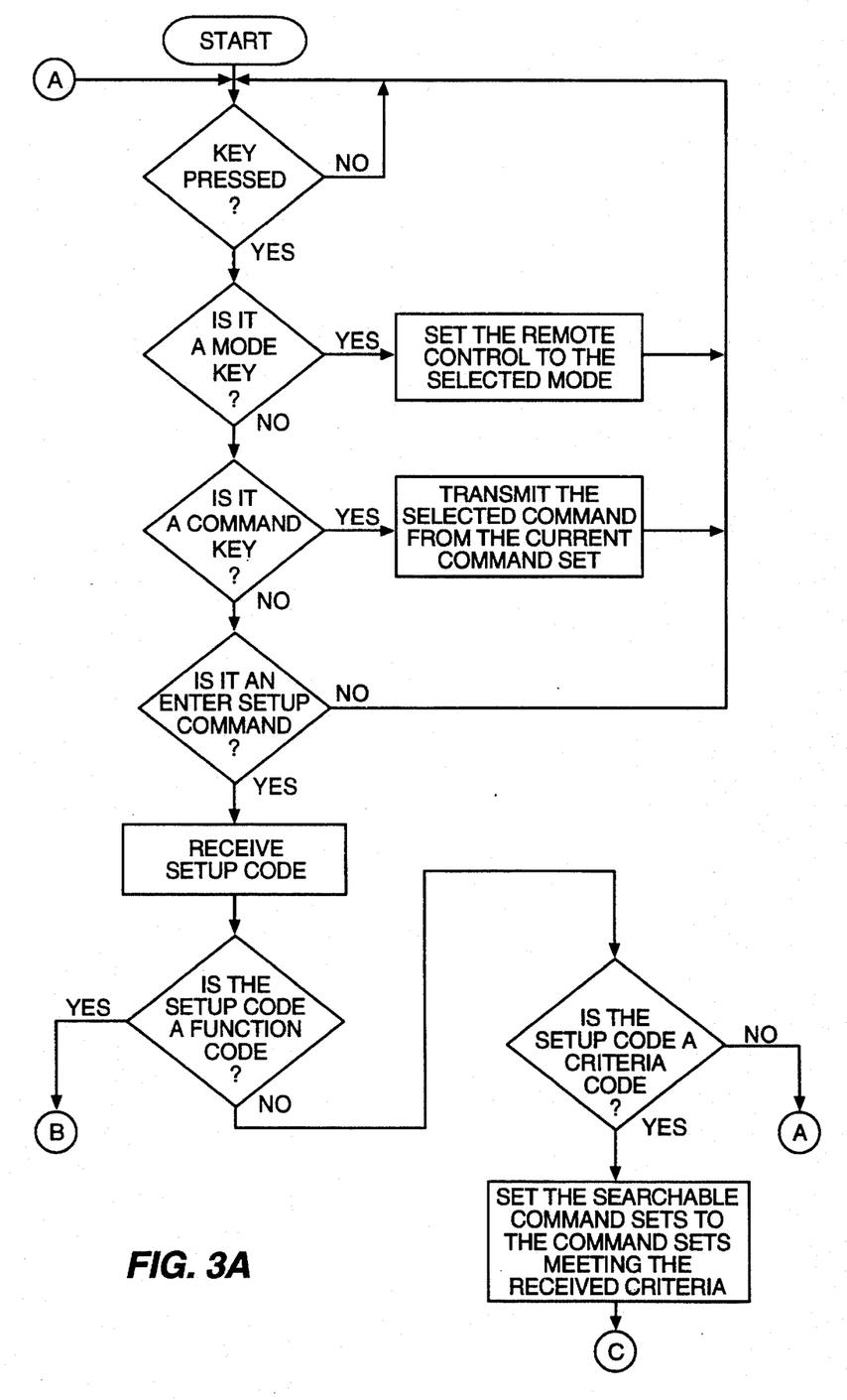
FIGS. 3A, 3B, 3C and 3D are each portions of a flow chart that together provide instructions for assisting in the control of the remote control with particular emphasis on the steps that provide for the method of selecting a remote control command set from a group of multiple command sets stored in the remote control.

FIG. 3A shows the starting point of the instructions to be executed by the microprocessor 42 in controlling the remote control 10. The flow chart begins by waiting for an interrupt or an indication that a key or switch 12 has been pressed or actuated. Upon actuation of a key or switch 12, a determination is made as to which key has been pressed.

If a mode key 18 is pressed the remote control 10 sets the current command set from which commands will be transmitted to the command set chosen for the selected mode. The mode keys 18 preferably include separate mode keys 18 for a TV, a VCR, a Cable Box, as well as any other device for which an infra-red remote control transmitter could be used to remotely control the device.

If a command key is pressed, the remote control 10 transmits the particular operating command associated with the pressed command key from the currently selected command set.

If an enter setup key is pressed the remote control 10 enters a setup mode used to configure the remote control 10. In the preferred embodiment the enter setup key is equivalent to the magic key 20, however it can take any one of various forms including a slider switch or a combination of key presses.

Upon entering the setup mode, the remote control 10 waits until it receives a set up code. If the setup code is a setup function code, the execution of operating instructions of the remote control 10 branches to FIG. 3B to perform instructions to determine which function code has been requested to be performed.

Figure 3B:
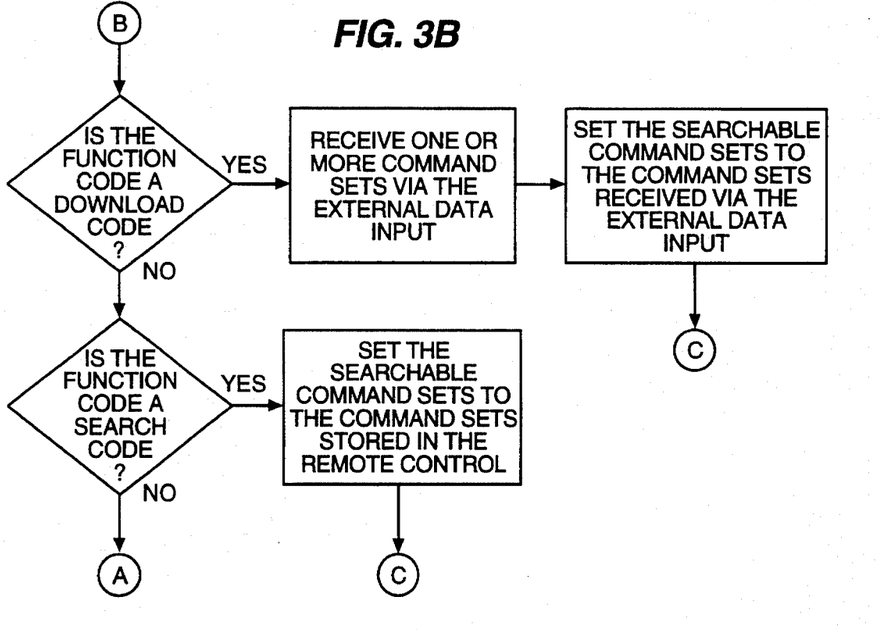
Figure 3C:
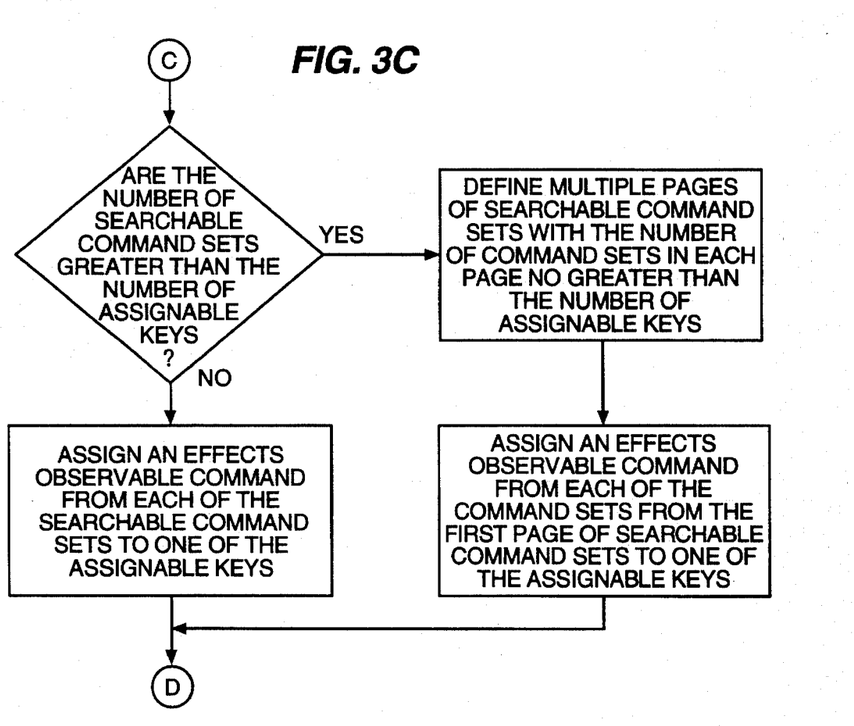

If the setup code is a criteria code, indicating a particular subset of command code sets, the remote control sets the searchable command sets to the command sets meeting the received criteria and branches the execution of instructions to FIG. 3C to perform instructions to select a new command set for the currently active mode.

The criteria code allows the remote control to restrict the number of searchable command sets to only those command sets used with devices meeting a particular criteria and\or to determine a different order of assigning the effects observable commands.

Preferably the effects observable commands will be assigned to the user actuated keys in order of decreasing popularity. However a command set that is not very popular when one considers the entire list of stored command sets used for operating a television, may be the most popular command set used for operating a television manufactured by a particular manufacturer. The use of a criteria code representing a particular manufacturer by the user can be used to establish a different assignment order based on the popularity of command sets following the indicated criteria.

Examples of different possible criteria include codes for different manufacturers, codes for equipment manufactured or purchased between a specified time period, devices sold through a particular retail outlet, etc.

Additionally in some embodiments it is possible to allow for the entry of multiple criteria in order to further isolate the proper command set for operating a particular device.

If the setup code is neither a function code nor a setup code, it is assumed the user inadvertently entered the setup mode and the execution of the operating instructions of the remote control 10 branches to the start of the instructions in FIG. 3A.

FIG. 3B shows the program steps performed when a function code is received after entering the setup mode. First a determination is made to identify which function is being requested to be executed. If the function code is determined to be a download code, the remote control executes a procedure to receive one or more command sets via the external data input. The searchable subset of command sets are defined to include the received command sets and the execution of the operating instructions branches to FIG. 3C.

Similarly, an alternative embodiment can allow the received command sets to supplement the command sets previously stored in the remote control 10.

In the embodiment disclosed in FIGS. 3A through 3D the remote control enters a command set selection procedure after downloading the received data, however it is not necessary for the selection procedure to be entered immediately after downloading of the received data, but can be delayed until the user chooses. Similarly, the data received does not necessarily have to be one or more command sets, but can include updates to already stored command sets or other related data.

If the function code is a search code, the searchable set of commands is defined to include the command sets stored in the remote control without first inputting a criteria code or downloading command sets. This allows the user to directly enter the procedure to select the new command set without first entering a criteria code or performing another function.

Figure 3D:
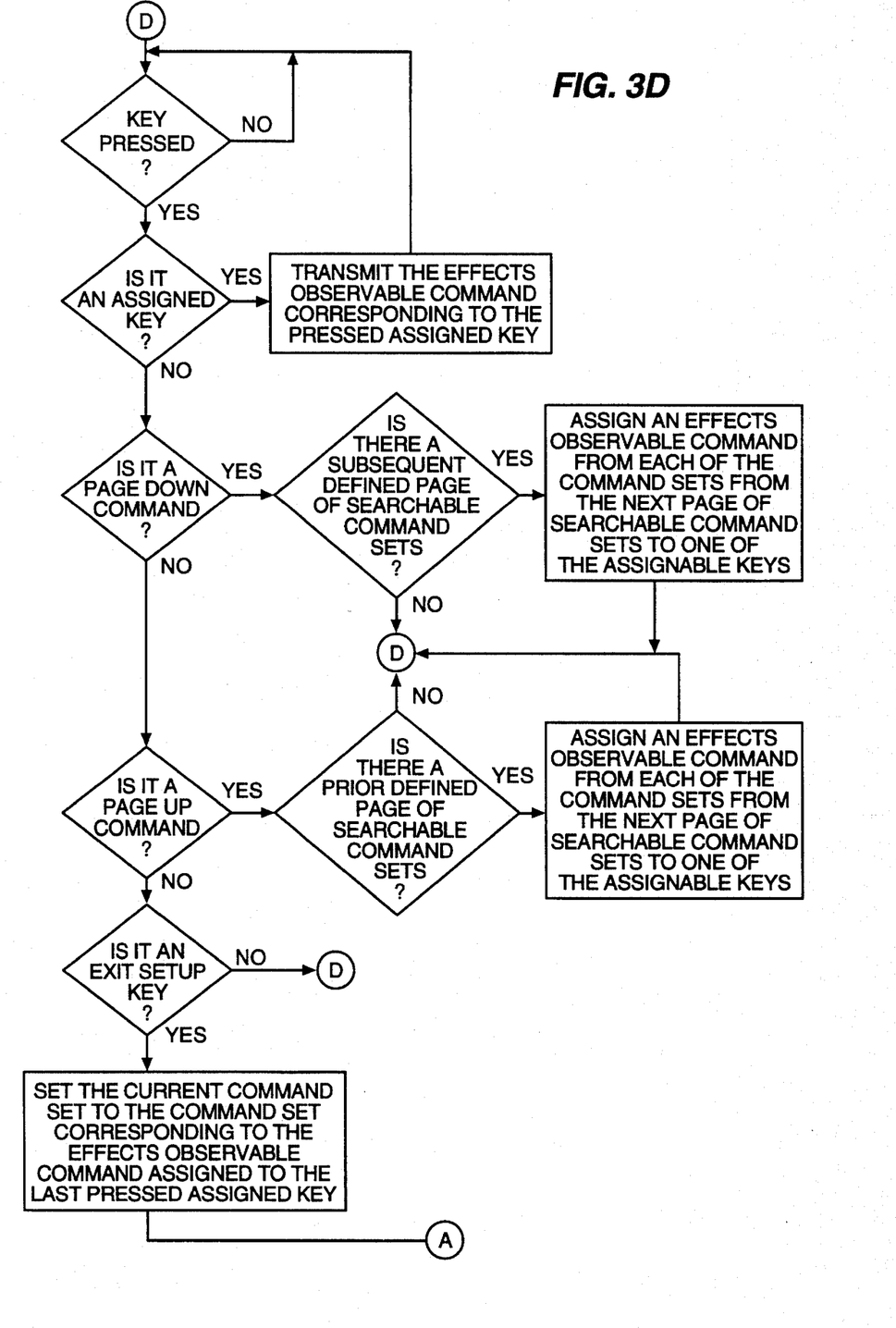

FIGS. 3C and 3D shows the program steps for selecting the new command set from the list of searchable command sets. Initially, as shown in FIG. 3C a determination is made whether the number of searchable command sets exceeds the number of assignable user actuated keys or switches.

If the number of searchable command sets is greater than the number of assignable user actuated keys or switches the searchable command sets are broken up into multiple pages of command sets no greater in size than the number of assignable user actuated keys that can be paged through using the channel up and channel down keys 22. The effects observable commands from the currently selected page, initially the first page, of command sets is assigned to the assignable user actuated keys.

If the number of searchable command sets is equal to or less than the number of assignable user actuated keys or switches, the effects observable commands from the searchable command sets, forming a single page of command sets, are assigned to the assignable user actuated keys.

After the effects observable commands for the currently selected page have been assigned, the remote control 10 waits for a key to be pressed. When a key press has been detected the remote control 10 determines if the key pressed is an assignable user actuated key, a key which has had an effects observable command assigned to it. If it is then the remote control transmits the assigned effects observable command (e.g., a "power off" command) to the device to be remotely controlled and loops back to wait for another key press. The user observes the device to be remotely controlled for a visual indication of a compatible command.

In the preferred embodiment the assignable user actuated keys include the power key 14 and the numeric keys 16. The assignable user actuated keys are assigned in the order of the power key 14 first, followed by the numeric keys 16 in order starting with the "one" key and ending with the "zero" key. Additionally the preferred effects observable command is a power off command.

If the key pressed is a page down command (i.e. a channel down key 22), and a subsequent page of command sets is defined. Then the remote control 10 reassigns an effects observable command from each of the command sets from the subsequent page of command sets to the assignable user actuated keys and loops back to wait for another key press.

If the key pressed is a page up command (i.e. a channel up key 22), and a prior page of command sets is defined, then the remote control reassigns an effects observable command from each of the command sets from the prior page of command sets to the assignable user actuated keys and loops back to wait for another key press.

If the key pressed is an exit setup key (i.e. a magic key 20), then the remote control 10 sets the current command set for the currently selected mode to the command set corresponding to the effects observable command assigned to the last pressed assigned key. Typically the user exits the setup procedure when the user observes the desired effect on the device to be controlled by the remote control 10, indicating that a compatible command set has been located.

In this way a method for selecting a compatible command set from a library of multiple command sets can be realized. Similarly different command sets can be selected for each of the different device modes by selecting the mode key 18 corresponding to the desired mode prior to entering the setup procedure.

Often times, a plurality of brands of electronic devices, e.g., television sets may share a device entry code. For example, the Panasonic code, 035, is also the entry code for a private labelled television set sold by Montgomery Wards. This is illustrated in FIG. 4.

Figure 4:
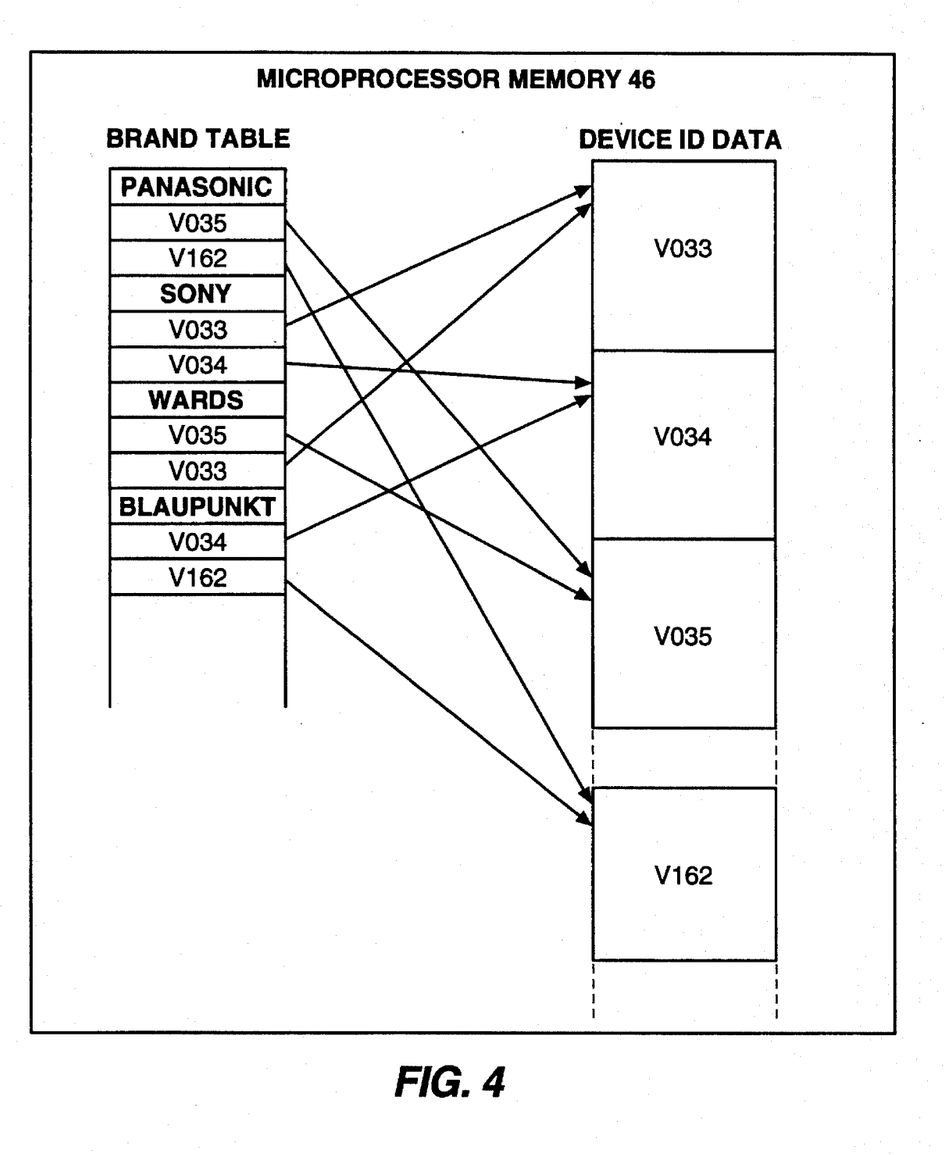
FIG. 4 is schematic layout of a portion of a BRAND TABLE and of a list of DEVICE ID DATA stored in a memory (RAM) of a microprocessor shown in FIG. 2.

Additionally, as shown in FIG. 4, the priority order may be different from brand name to brand name, even though they use the same device entry code. For example the Sony number 1 code is 033, but this device entry code is only the Wards number 2 code.

From the foregoing description, it will be apparent that the method for selecting a remote control command set from a group of multiple command sets stored in a remote control, for controlling various remotely controllable electronic devices of the present invention has a number of advantages, some of which have been described above and others of which are inherent in the method of the invention. Also it will be understood that modifications can be made to the method for selecting a remote control command set described above without departing from the teachings of the invention.

I claim:

1. A method for selecting an appropriate one of a plurality of command sets stored in a remote control having a plurality of assignable user actuated switches or keys for controlling a remotely controllable electronic device, comprising the steps of:

(a) assigning an effects observable command from each of said plurality of command sets to one of said plurality of assignable user actuated switches or keys, each assigned, effects observable command to be transmitted when the corresponding one of the assignable user actuated switches or keys is actuated;

(b) actuating sequentially and individually each one of the plurality of assignable user actuated switches or keys, to individually transmit each assigned effects observable command until the proper effect is observed;

(c) halting the actuating of the plurality of assignable user actuated switches or keys; and (d) setting the remote control to transmit future remote control commands from the command set containing the last transmitted effects observable command.

2. The method of claim 1, further comprising the step of receiving the plurality of command sets from an external source prior to the step of assigning an effects observable command.

3. The method of claim 2, wherein said external source communicates with the remote control via a wireless signal transmission.

4. The method of claim 2, wherein said external source communicates with the remote control via a wired signal transmission.

5. The method of claim 2, wherein said external source communicates with the remote control via a magnetic modem coupled to a telephone handset.

6. The method of claim 1, further comprising the step of receiving a code input from the user and wherein said code input is used to identify a subset of command sets meeting a particular criteria, from which said effects observable commands are assigned from.

7. The method of claim 6, wherein said particular criteria refer to command sets which control electronic devices manufactured by a specific manufacturer.

8. The method of claim 6, wherein said particular criteria refer to command sets which control electronic devices manufactured within a specific time period.

9. The method of claim 6, wherein said particular criteria refer to command sets which control electronic devices sold through a particular retail outlet.

10. The method of claim 1, wherein said effects observable command is a power off command.

11. The method of claim 1, wherein said plurality of assignable user actuated switches or keys include a power key and numeric keys.

12. The method of claim 1, wherein said remote control further includes a plurality of user actuated mode keys for selecting one of a plurality of modes and said method further includes the step of selecting one of the plurality of modes prior to the step of assigning an effects observable command, such that, the method for selecting an appropriate one of a plurality of command sets can be performed to separately set a different command set for each mode.

13. The method of claim 1, wherein said remote control further includes a page down user actuated key and a page up user actuated key and, when the number of command sets exceed the number of assignable user actuated switches or keys, said method further includes the steps of: assigning an effects observable command from each of said plurality of command sets in a subsequent group of command sets to one of said plurality of assignable user actuated switches or keys, when a page down user actuated key is actuated; and assigning an effects observable command from each of said plurality of command sets in a prior group of command sets to one of said plurality of assignable user actuated switches or keys, when a page up user actuated key is actuated.

14. The method of claim 1, wherein the order of said effects observable commands from said plurality of command sets is assigned to said plurality of assignable user actuated switches or keys based upon decreasing popularity of usage of each of said command sets.

15. The method of claim 14, further comprising the step of receiving a code input from the user and wherein said code input indicates a particular criteria and is used to further determine the order said effects observable commands are assigned to said plurality of assignable user actuated switches or keys based upon decreasing popularity of usage of each of said command sets conforming to said criteria.

16. An apparatus for selecting an appropriate one of a plurality of command sets stored in a remote control having a plurality of assignable user actuated switches or keys for controlling a remotely controllable electronic device, comprising:

means for assigning an effects observable command from each of the plurality of command sets to one of said plurality of assignable user actuated switches or keys;

means for transmitting said effects observable command when the corresponding one of said plurality of assignable user actuated switches or keys is actuated;

means for indicating the halting of the actuation of the plurality of assignable user actuated switches or keys; and means for setting the remote control to transmit future remote control commands from the command set containing the last transmitted effects observable command.

* * * * *